(12) United States Patent
Murray et al.

(10) Patent No.: US 7,861,139 B2
(45) Date of Patent: Dec. 28, 2010

(54) PROGRAMMING MANAGEMENT DATA FOR NAND MEMORIES

(75) Inventors: Michael Murray, Mountain View, CA (US); William Henry Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 1007 days.

(21) Appl. No.: 11/698,455

(22) Filed: Jan. 26, 2007

(65) Prior Publication Data
US 2008/0184094 A1 Jul. 31, 2008

(51) Int. Cl.
*G11C 29/00* (2006.01)
(52) U.S. Cl. ...................................................... 714/763
(58) Field of Classification Search ................ 714/763, 714/762, 788, 752
See application file for complete search history.

(56) References Cited

U.S. PATENT DOCUMENTS

| | | | |
|---|---|---|---|
| 6,119,259 A * | 9/2000 | Jeong ........................ 714/746 |
| 6,539,512 B1 * | 3/2003 | Jeong et al. ................. 714/752 |
| 2004/0083334 A1 * | 4/2004 | Chang et al. ................ 711/103 |
| 2005/0055610 A1 * | 3/2005 | Sassa et al. .................. 714/54 |
| 2007/0113154 A1 * | 5/2007 | Kojima ....................... 714/763 |

* cited by examiner

*Primary Examiner*—Guy J Lamarre
(74) *Attorney, Agent, or Firm*—Schwegman, Lundberg & Woessner, P.A.

(57) ABSTRACT

Methods, apparatus, systems, and data structures may operate to generate or store error correction data for each of a plurality of sectors of a page except for a particular sector in the page and combining a block management data with the particular sector to generate a modified sector. Additionally, various methods, apparatus, systems, and data structures may operate to generate or store error correction data for the modified sector and combining the plurality of sectors, the error correction data for each of the plurality of sectors other than the particular page, and the block management data and the error correction data for the modified sector.

36 Claims, 7 Drawing Sheets

PROGRAMMING MANAGEMENT DATA FOR NAND MEMORIES

TECHNICAL FIELD

Various embodiments described herein relate generally to non-volatile memory devices including error correction used in conjunction with non-volatile memory devices.

BACKGROUND

An Error Correcting Code (ECC) engine is a device which performs a process of detecting and correcting errors to ensure the accuracy and integrity of data during a data transmission. Typically, in memory systems, a memory controller writes data and ECC data to the memory device. The ECC data is used by the controller during a read operation to identify and correct errors that may have occurred since the data was written to the memory.

Memory devices can be categorized in two broad areas: volatile and non-volatile. Volatile memory devices require power to maintain data, while non volatile memories are capable of maintaining data in the absence of a power supply. An example of a non-volatile memory is the flash memory that stores information in a semiconductor device without the need for power to maintain the information in the chip.

Flash memory can be built using either NOR or NAND devices. NAND flash can be either of single-level cell (SLC) or multi-level cell (MLC) configuration. MLC NAND flash allows for a higher density memory device in comparison to SLC NAND flash because it allows the storage of two or more data bits in each memory cell. With the use of multiple levels to increase the memory density, more errors can occur during programming of the MLC NAND and an efficient error correction scheme is needed.

DETAILED DESCRIPTION

Figure 1:
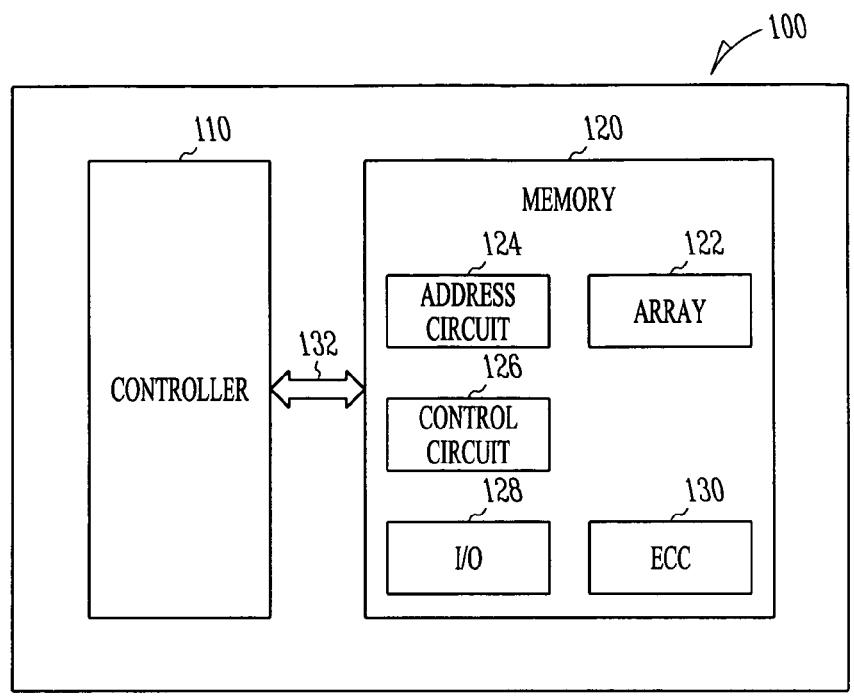
FIG. 1 illustrates a block diagram of a memory system, according to various embodiments of the invention.

FIG. 1 illustrates a block diagram of a memory system 100, according to various embodiments of the invention. In various embodiments, system 100 includes an integrated circuit memory 120 and a controller 110. Memory 120 includes an array of non-volatile floating gate memory cells 122, address circuitry 124, control circuit 126, Input/Output (I/O) circuitry 128, and error correction system 130. Memory array 122 may also be referred to as an array of flash memory cells because blocks of memory cells are typically erased concurrently, in a 'flash' operation. In various embodiments, the memory array comprises a NAND Flash memory array.

In various embodiments, a control circuit 126 is provided to manage memory operations, such as read, write and erase operations. As explained below, one memory operation performed by the memory control circuit 126 includes an internal data move operation.

In various embodiments, memory 120 may be coupled to a processor or other memory controller 110 for accessing the memory array 122. In various embodiments, memory 120 may be coupled to a processor (not shown) and may form part of an electronic system. The novel apparatus and systems of various embodiments may comprise and/or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Memory 120 receives control signals across I/O lines 132 from a processor in controller 110 to control access to the memory array 122 via control circuitry 126. Access to the memory array 122 is directed to one or more target memory cells in response to address signals received across I/O lines 132. Once the array 122 is accessed in response to the control signals and the address signals, data can be written to or read from the memory cells across I/O lines 132.

It will be appreciated by those skilled in the art that additional circuitry and control signals may be provided, and that the memory device of FIG. 1 has been simplified to help focus on the embodiments of the invention. It will be understood that the above description of a memory device is intended to provide a general understanding of the memory and is not a complete description of all the elements and features of a typical memory device.

In various embodiments, system 100 includes an error correction system 130 for storing ECC information provided by controller 110. Error correction system 130 may store an indication of the ECC scheme employed by the controller, for example Hamming, BCH, or Reed-Solomon coded, etc. In addition to the type of ECC used by the controller, error correction system 130 can store an address, or offset, of the location of the ECC data bytes associated with array data.

The system 100, in some embodiments, may comprise a processor (not shown) coupled to a display and/or a wireless transceiver. The memory array(s) 122 included in the memory 120 may also be operatively coupled to the processor.

In some embodiments, the system 100 may comprise a camera, including a lens and an imaging plane to couple to a processor. The imaging plane may be used to receive light captured by the lens.

Many variations are possible. For example, in some embodiments, the system 100 may comprise a cellular telephone receiver (not shown) forming a portion of the wireless transceiver. In some embodiments, the system 100 may comprise an audio, video, or multi-media player, including a set of media playback controls to couple to the processor.

Any of the components previously described may be implemented in a number of ways, including embodiments in software. Software embodiments may be used in a simulation system, and the output of such a system may be used to operate various portions of the memory 129 and system 100 described herein.

ECC techniques are well known in the art and are not listed or described in detail herein. It will be understood that embodiments of the invention can be implemented without limitation to a specific ECC code(s). If an error is detected, the controller 110 can read the data from the memory 120 into a buffer of the controller, perform an ECC operation to correct the error, and write the corrected data back into memory 120.

Figure 2:
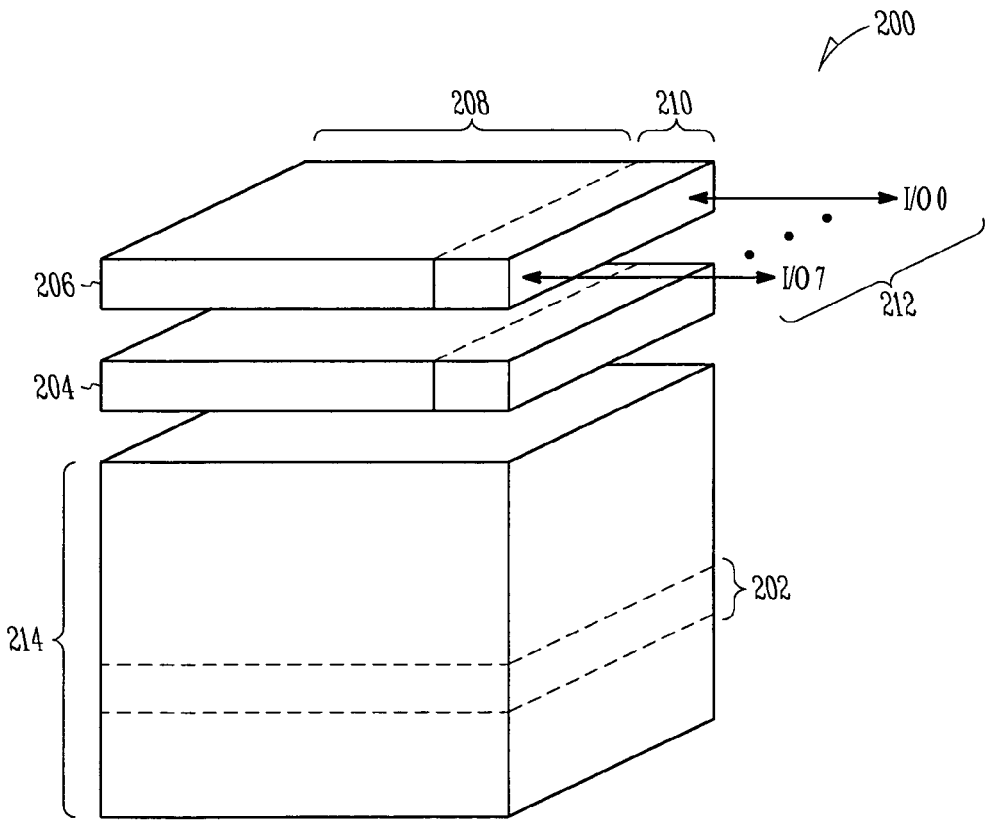
FIG. 2 illustrates a schematic diagram showing the organization of arrays of memory cells in a memory system, according to various embodiments of the invention.

FIG. 2 illustrates a schematic diagram showing the organization of arrays of memory cells in memory system 200, according to various embodiments of the invention. Memory system 200 includes a block 202, a data register 204, a cache register 206, a data area 208, a spare area 210, I/O ports 212 and a plane 214. The memory system 200 may comprise SLC or MLC memory, including NAND flash memory. The data are transferred to and from the NAND flash memory 200, byte by byte through the data register 204 and the cache register 206. The cache register 206 may be located closest to I/O control circuits and acts as a data buffer for the I/O data, whereas the data register 204 may be closest to the memory array and acts as a data buffer during the operation of the NAND flash memory. In various embodiments, the length of data area 208 is defined as a "page".

The memory is programmed and read in page-based operations, and is erased in block-based operations. During page operations, the data and cache registers may be tied together and act as a single register. During cache operations, the data and cache registers may operate independently to increase data throughput.

NAND flash memory structured as shown in FIG. 2 may be composed of blocks of pages. Each block may be composed of 16, 32, or 64 pages. In various embodiments, each page may have 512 bytes (216 words) in data area 208 and an extra 16 bytes (8 words) in spare area 210. In various embodiments, each page may have 2048 bytes (1024 words) in data area 208 and 64 bytes (32 words) in spare area 210. Spare area 210 may be used to stores bits used for marking invalid blocks during the production process. Additionally, spare area 210 may be used to store ECC check bits. Marking invalid blocks can be performed by software operating on a set of bits contained within the block management data. In various embodiments, this software may also provide the ECC code if the processor does not include ECC hardware.

In various embodiments of SLC NAND memory, the data in the spare area can be programmed with the host sectors or separately. For example, allocation management information or block management information and ECC check bits may be programmed first before the data arrives from the host. Additionally, ECC check bits for host data may be programmed at the same time as the host data.

In various embodiments of MLC NAND memory, the spare area data must be programmed at the same time as the host data. Additionally, a whole page may be programmed at the same time. The block management data can be determined before the host sectors are received at a buffer, but may not be programmed until the host data is programmed. In several embodiments, the block management is added to one of the host sectors as the sectors are streamed through an ECC circuit before the host data is programmed into the memory. Consequently, no additional time is necessary compared to separately performing error correction for the block management data.

In various embodiments of the memory system 200 shown in FIG. 2, the read and program operation procedures take place on a page basis (e.g., 528 bytes at a time as opposed to a byte or word basis that is performed in NOR flash memories). Additionally, the erase operation takes place on a block basis. In operation, during a page read operation in various embodiments, a page of 528 bytes is transferred from memory into the data register for output. In a page program operation, a page of 528 bytes is written into the data register and then programmed into the memory array. Also, in a block erase operation, a group of consecutive pages may be erased in a single operation.

Figure 3:
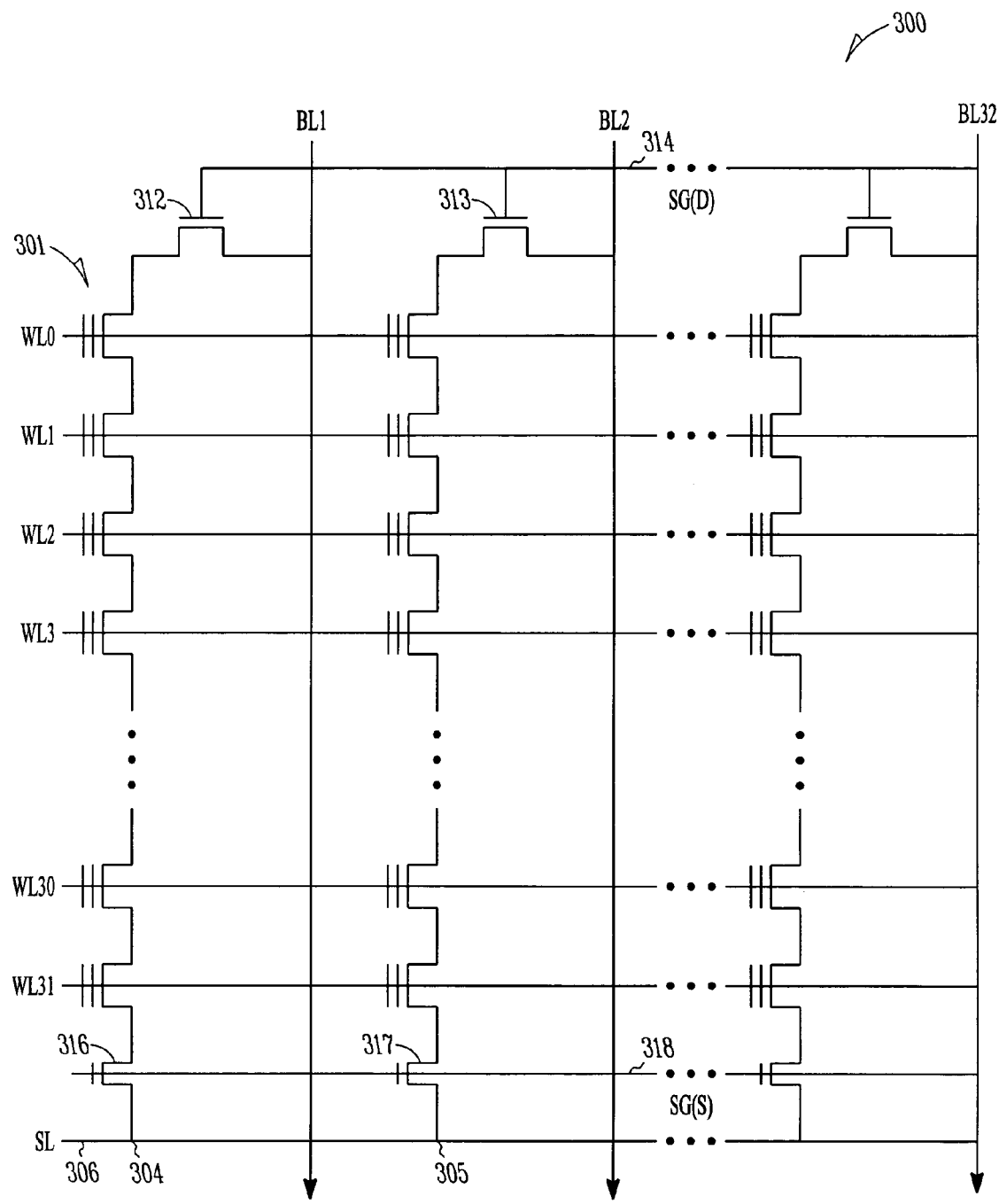
FIG. 3 illustrates a schematic diagram of a NAND flash memory array, according to various embodiments of the invention.

FIG. 3 illustrates a schematic diagram of a NAND flash memory array 300, according to various embodiments of the invention. Memory array 300 does not show all of the elements typically used in a memory array. For example, only three bit-lines are shown (BL1, BL2 and BL32) while the number of bit-lines employed actually depends on the memory density. The bit-lines are subsequently referred to as (BL1-BL32).

The NAND memory includes an array 300 of floating gate memory cells 301 arranged in series of strings 304, 305. Each of the floating gate memory cells 301 may be coupled drain to source in each series string 304, 305. A word line (WL0-WL31) that spans across multiple series strings 304, 305 is coupled to the control gates of every floating gate cell in a row in order to control their operation. The bit-lines (BL1-BL32) are eventually coupled to sense amplifiers (not shown) that detect the state of each cell 301.

In operation, the word-lines (WL0-WL31) select the individual floating gate memory cells in series strings 304, 305 that are to be written to or read from and operate the remaining floating gate memory cells in each series string 304, 305 in a pass-through mode. Each series string 304, 305 of floating gate memory cells is coupled to a source line 306 by a source select gate 316, 317 and to an individual bit-line (BL1-BL32) by a drain select gate 312, 313. The source select gates 316, 317 are controlled by a source select gate control line SG(S) 318 coupled to their control gates. The drain select gates 312, 313 are controlled by a drain select control line SG(D) 314.

Each cell can be programmed as a single bit per or multiple bits per cell. SLC allows programming a single bit per cell, and MLCs allow programming multiple bits per cell. Each cell's threshold voltage ($V_t$) determines the data that is stored in the cell. For example, in a single bit per cell architecture, a $V_t$ of 1V might indicate a programmed cell while a $V_t$ of −1V might indicate an erased cell. The multilevel cells have more than two $V_t$ windows, each indicating a different state. MLCs take advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage $V_t$ distributions, each having a width of approximately 200 mV. In various embodiments, a separation of 0.3V to 0.5V is assigned between each $V_t$ distribution range as well. This separation zone between the $V_t$ distributions is established so that the multi $V_t$ distributions do not overlap causing logic errors. During verification, if the voltage stored on the cell is sensed to be within the 01 high $V_t$ distribution, then the cell is storing a 01. If the voltage is within the 00 second highest distribution, the cell is storing a 00. This continues for as many ranges (levels) as are used for the cell.

During a programming operation, the selected word line (WL) for the flash memory cell to be programmed is supplied with a train of high voltage programming pulses. The high voltage programming pulses typically start at 16V and increment in 0.5V increments. A 10V non-incrementing, high voltage pulse is applied on the unselected WLs.

To inhibit selected cells from programming on the selected WLs, in one embodiment, the channel of the inhibited cell is decoupled from the bit-line (BL) by applying ~1.3V on the BL. To program selected cells on the selected WL, the channel is grounded to 0V through the BL. The large potential formed between the channel and the WL is designed to cause the cell to program and the $V_t$ of the device will increase as higher programming pulses are applied.

In various embodiments, between every programming pulse, a verification phase is performed. During verification, the selected WL is lowered to 0V, the unselected WLs are lowered to 5V, and the states of the selected cells are sensed. If the cell is programmed to have a $V_t$ level such that the 0V on the WL does not induce the device to conduct, the device is considered to be programmed. Otherwise, the cell is considered to be erased and the programming pulse height is increased by 0.5V and applied to the selected WL again. This process is repeated until all selected cells to be programmed have indeed been programmed.

A typical memory block may comprise 64 logical pages. The 64 logical pages can be formed with 32 physical WLs. Each WL may contain 2 logical pages. For example, there may be 4 Kbit cells on a WL. Of these, 2 Kbits may be dedicated to one page that shares the same WL with another 2 Kbit page. If every cell is used in a multi $V_t$ distribution level mode then a WL with the described configuration will hold 4 pages having 2 Kbits per page. When one of these pages is being programmed, the second page on the same WL will experience a disturb condition even though it is inhibited. Therefore pages with shared WLs can experience programming disturb. The programming disturb caused on the shared WL will shift the $V_t$ distribution of cells that are previously programmed in the second page that is on the same WL and make their distribution wider. For non-volatile memory devices that use two levels per cell this may not be a major problem, since the separation zone between the two distributions may be large enough to prevent the distributions from overlapping due to the disturb condition. However, for MLC operations, where a single cell is used to represent 2 bits or 4 levels per physical single cell, the separation zone is reduced and reducing the disturb condition becomes desirable in order to prevent $V_t$ distributions from overlapping or shifting.

Figure 4:
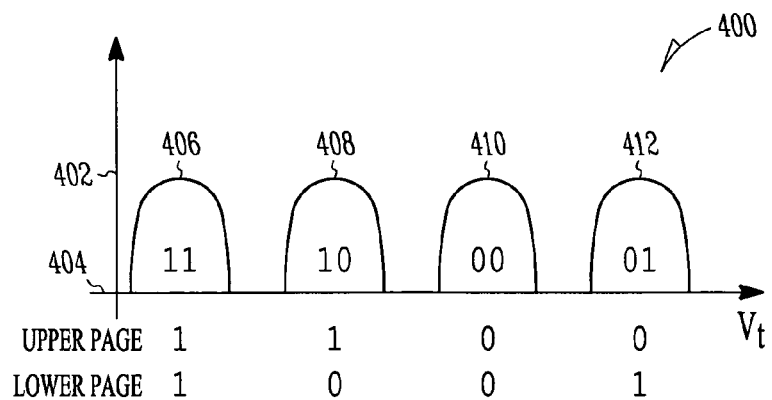
FIG. 4 illustrates a diagram showing the distribution of threshold voltages of the multi-level cell (MLC) array shown in FIG. 3, according to various embodiments of the invention.

FIG. 4 illustrates a diagram 400 showing the distribution of threshold voltages of the NAND flash memory array of FIG. 3, according to various embodiments of the invention. The distribution of threshold voltages in diagram 400 shows that each memory cell stores two bits of data, namely four data states. Diagram 400 includes a y-axis 402 representing threshold voltage and an x-axis 404 having curves 406, 408, 410 and 412 representing the logical levels in a memory cell. Curve 406 represents the distribution of the threshold levels $V_t$ of the cells within array 122 (see FIG. 1) that are in the erased state being in negative threshold voltages. Curves 408 and 410 are shown to represent threshold voltage distributions for storing "10" and "00", respectively. Additionally, curve 408 is between 0V and 1V and curve 410 is between 1V and 2V. Curve 412 shows the distribution of cells that have been programmed to the "01" state as being in the highest threshold voltage level set to more than 2V and less than 4.5V.

Each of the two bits stored in a single memory cell, as described in the above example, is from a different logical page. That is, each bit of the two bits stored in each memory cell carries a different logical page address from the other. The lower page bit shown in FIG. 4 is accessed when an even page address (0, 2, 4, . . . . N/2) is requested. The upper page bit is accessed when an odd page address (1, 3, 5, . . . . [N/2+1]) is requested. In order to provide improved reliability, individual distributions may be reduced, thereby providing greater read margins.

In a read operation, the word line of a target (selected) memory cell can be maintained at a low voltage level. All unselected cell word lines can be coupled to a voltage sufficiently high to activate the unselected cells regardless of their floating gate charges. If the selected cell has an uncharged floating gate, it is activated. The bit line and source line are then coupled through the series of memory cells in the array. If the selected cell has a charged floating gate, it will not activate. The bit line and source lines in that case are not coupled through the series of memory cells.

Some NAND flash memory devices contain initial bad blocks within the memory array (block). These bad blocks may be marked as bad by the manufacturer, indicating that they should not be used in any system. Additionally, the NAND device can degrade and wear out thereby resulting in more bad blocks being generated during normal device operation. Moreover, bit errors can occur during NAND flash device operation or during long periods of inactivity. Consequently, the NAND flash memory may be provided with an ECC feature to ensure data integrity.

NAND flash memory may include extra storage termed "spare area" on each page. In various embodiments, the spare area includes 64 bytes (16 bytes per 512 byte sector). In various embodiments, the spare area is used to store information such as the ECC and block management data used for storing bad block information and wear-leveling or logical-to-physical block mapping. Wear-leveling includes translating a logical memory address to different physical memory addresses each time a file is programmed. Wear-leveling spreads NAND flash memory-cell use over the entire range of the memory array, thereby equalizing use of all the memory cells, and helping extend the life of the device. This operation may be monitored and implemented by a controller connected to the NAND flash memory device.

Figure 5:
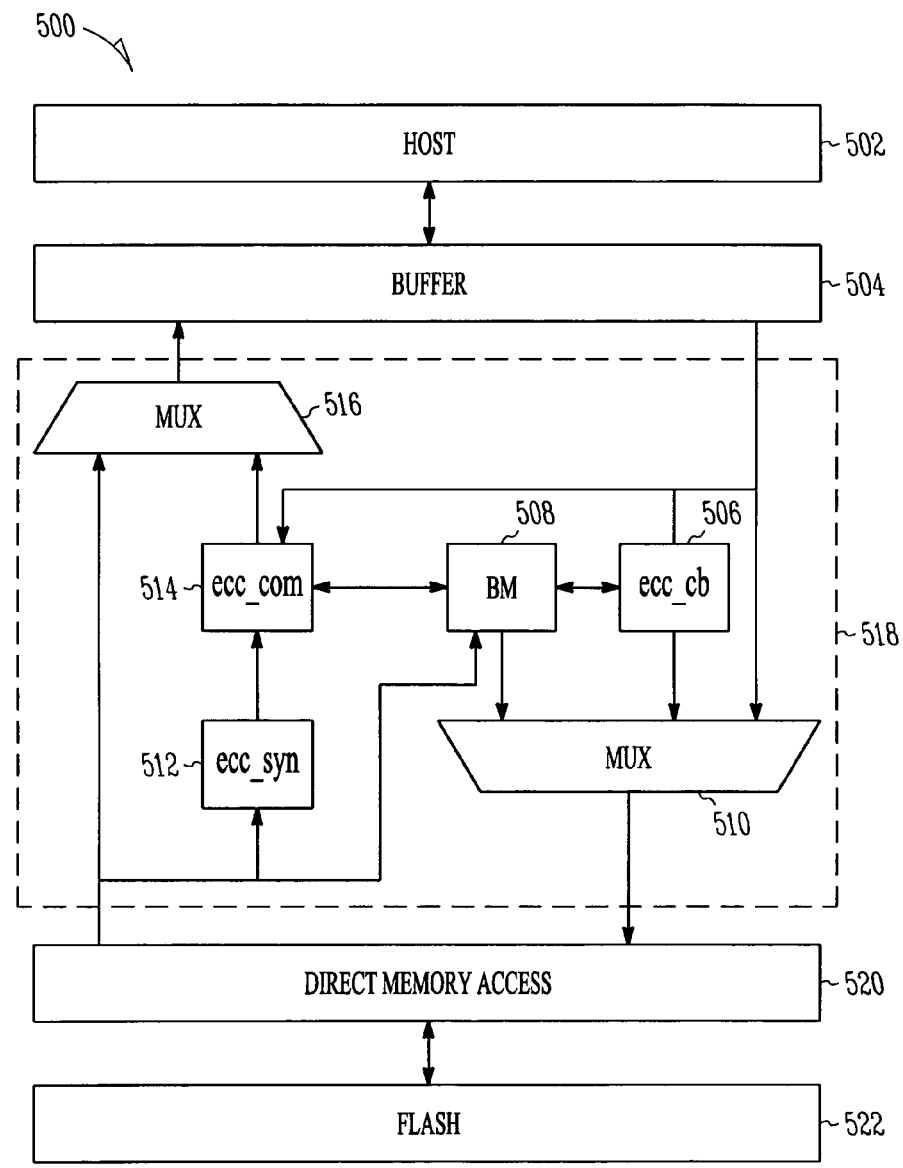
FIG. 5 illustrates a block diagram of a system showing an error correction apparatus, according to various embodiments of the invention.

FIG. 5 illustrates a block diagram of system 500 showing an apparatus for error correction, according to various embodiments of the invention. System 500 includes a host 502, a buffer 504, an error correction system 518, a direct memory access controller (DMA) 520 and a flash memory 522. Error correction system 518 includes an error correction check bits generator 506, a block management data block 508, a first multiplexer 510, a syndrome generator 512, an error correcting module 514, and a second multiplexer 516. In various embodiments, system 500 comprises a NAND flash memory controller implemented in software, hardware or a combination of the two. The controller of system 500 may be similar to or identical to the control circuit 126 of FIG. 11n various embodiments, buffer 504 is coupled to host 502 through a multi-media card interface (not shown). In various embodiments, error correction system 518 is implemented in a NAND flash controller hardware (not shown). Error correction can be performed in hardware or software. The error correction system 518 may be similar to or identical to the error correction system 130 of FIG. 1.

As shown in FIG. 5, host 502 is coupled to buffer 504 and DMA 520 is coupled to flash memory 522. Both buffer 504 and DMA 520 are configured to send and receive data from host 502 and flash memory 522 respectively. In various embodiments, transfer of data to and from host 502 and flash memory 522 is performed through an 8-bit- or 16-bit-wide bidirectional data bus. Output of buffer 504 is coupled to the inputs of error correcting module 514, error correction check bits generator 506 and first multiplexer 510. Output of first multiplexer 510 is coupled to an input of DMA 520. Output of DMA 520 is coupled to the inputs of syndrome generator 512, block management module 508 and second multiplexer 516.

In several embodiments, block management module 508 stores information regarding bad blocks (invalid blocks) and their locations within the memory block. Invalid blocks can be sorted into two groups, namely, inherent invalid blocks, and acquired invalid blocks. Inherent invalid blocks arise during the manufacturing process of the NAND device. On the other hand, acquired invalid blocks are not identified by the factory—these blocks originate at a customer site as a result of wear. Worn-out blocks are marked as invalid and no longer accessed if there is either a block erase or a page program failure. Acquired invalid blocks are usually marked in the same way as the inherent invalid blocks. Block management data block 508 is coupled to error correcting module 514 and error correction check bits generator 506 to send and receive data from error correcting module 514 and error correction check bits generator 506. Output of second multiplexer 516 is coupled to an input of buffer 504.

Figure 7A:
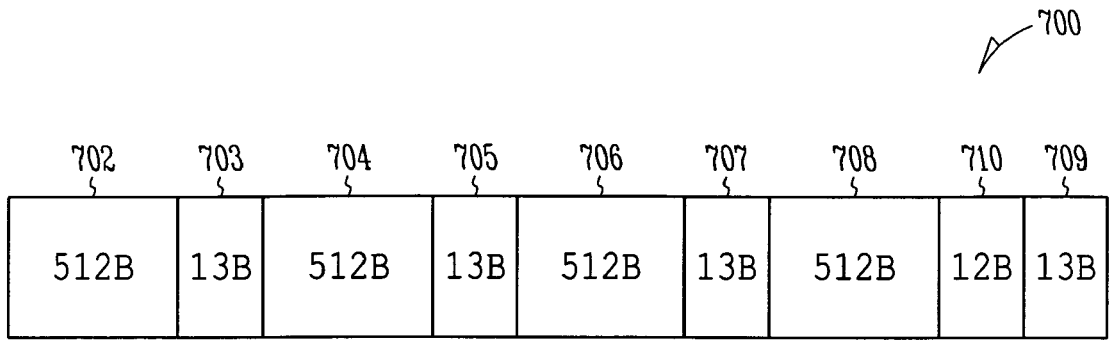
FIGS. 7A and 7B illustrate data structures of a page showing ECC combined with four sectors and block management data, according to various embodiments of the invention.
Figure 7B:
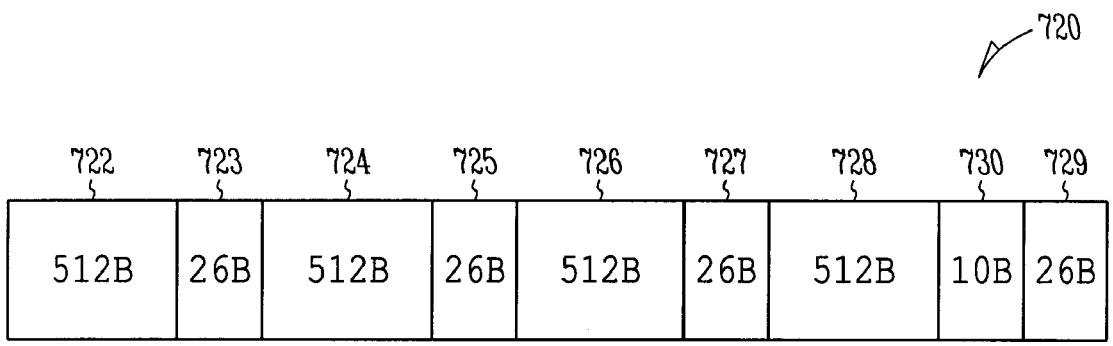
Figure 7C:
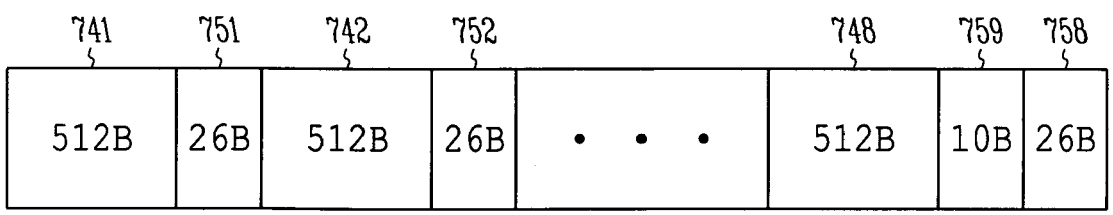
FIG. 7C illustrates a data structure of a page showing ECC combined with eight sectors and block management data, according to various embodiments of the invention.

In various embodiments, when a data word from host 502 is to be written into flash memory 522, the word is initially stored in buffer 504 as part of a page. In various embodiments, a page contains a series of sectors that has information from host 502 that is stored as bits of information. In various embodiments, when an instruction is received from a controller (not shown) to program the page into flash memory 522, error correction check bits are generated at error correction check bits generator 506 for each of the sectors contained within the page (except perhaps for the last sector of the page). The last sector of the page may be combined with the block management data provided by block management module 508 to form a modified sector. Error correction check bits are generated for the modified sector. The series of sectors other than the last sector, the modified sector, and their corresponding error correction bits are stored as a page in flash memory 522 as shown in FIGS. 7A-C.

In various embodiments, when a data word is read back from flash memory 522, the stored error correction check bits in the page are recomputed and compared to the stored error correction check bits read from flash memory 522. If a discrepancy is found as a result of the comparison, this indicates that an error has occurred. The result of such a comparison is called a syndrome and is generated at syndrome generator 512. If it is found that the syndrome is zero, it may be determined that there were no errors. If the syndrome is non-zero, it may be used to identify which data bits or ECC bits are in error, or to determine that the error is uncorrectable. In various embodiments, if the syndrome is non-zero, it can be used to index a table to determine which bits are in error. In various embodiments, this table lookup stage is implemented in hardware and in other embodiments it is implemented in software.

In several embodiments, the type of error correction codes implemented and the extent of error protection required in a given system depends on the type of data to be stored and the type of NAND flash technology used (SLC or MLC). In various embodiments, the error correcting codes used may include any one or more of Bose-Chaudhuri-Hocquenghem (BCH), Reed-Solomon (RS), Hamming, Golay, Reed-Muller, Goppa, and Denniston codes. In several embodiments, eight single bit errors may be corrected in any given sector using error correction codes. In various embodiments, sixteen single bit errors may be corrected in any given sector using error correction codes.

Figure 6:
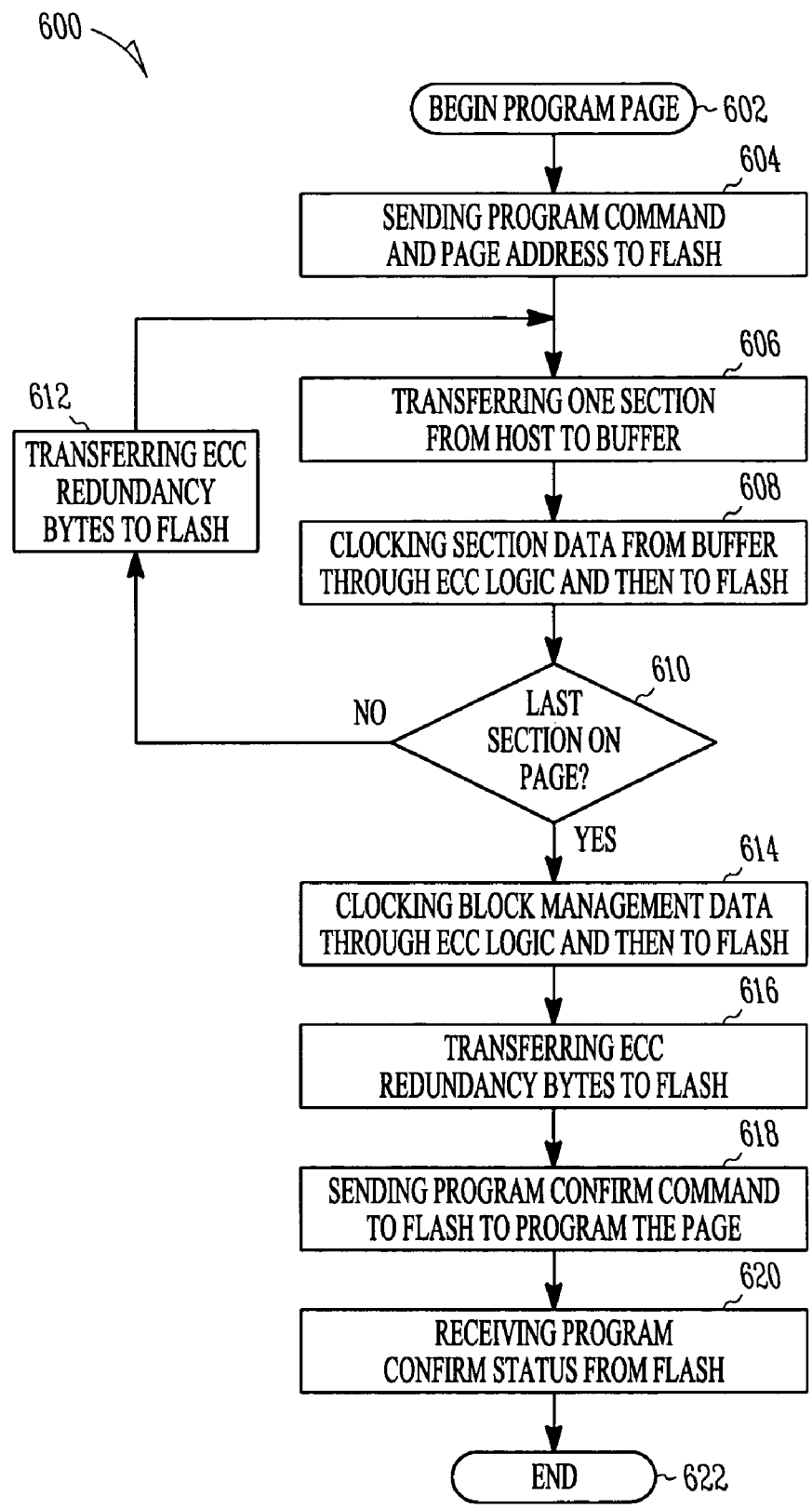
FIG. 6 illustrates a flow diagram showing a method of programming a page in a NAND flash memory, according to various embodiments of the invention.

FIG. 6 shows a flow chart of a method of programming a page in a NAND flash memory, according to various embodiments. Method 600 begins at block 602 to program a page. Referring now to FIGS. 5 and 6, it can be seen that method 600 may include at block 604 sending a program command along with a page address to flash memory 522. Method 600 may include at block 606 transferring one sector from host 502 to buffer 504. Method 600 may include at block 608 transferring the sectors stored in buffer 504 one at a time through the ECC logic in error correction system 518 to flash memory 522.

Method 600 may include at block 610 determining whether the sector is the last sector of the page. If the sector is determined to be the last sector then the method proceeds to block 614. If the sector is determined not to be the last sector then the method proceeds back to block 612 where the ECC bytes for the corresponding sector are transferred to flash memory 522.

Method 600 may include at block 614 clocking block management data through ECC logic and then to flash memory 522. Method 600 may include at block 616 transferring ECC redundancy bytes corresponding to the last sector and the block management data to flash memory 522. Method 600 may include at block 618 sending program confirm command to flash memory 522 in order to program the page. Method 600 may include at block 620 receiving the program confirm status from flash memory 522.

FIGS. 7A and 7B illustrate data structures of page 700 and 720 respectively showing ECC check bits combined with four sectors and block management data, according to various embodiments. As shown in FIG. 7A, page 700 includes fields 702-710. Fields 702, 704, 706 and 708 represent sectors containing data bits. Fields 703, 705, 707 and 709 correspond to ECC check bits generated for sectors 702, 704, 706 and 708, respectively. Field 710 includes block management data. In various embodiments, fields 702, 704, 706 and 708 collectively contain data to be transferred from host 502 to flash memory 522. In various embodiments, fields 702, 704, 706 and 708 include 512 bytes of information. In several embodiments, fields 703, 705, 707 and 709 include 13 bytes of ECC check codes. In various embodiments, block management data 710 includes 12 bytes of block management information.

As shown in FIG. 7B, page 720 includes fields 722-730. Fields 722, 724, 726 and 728 represent sectors containing data bits. Fields 723, 725, 727 and 729 correspond to ECC check bits generated for sectors 722, 724, 726 and 728, respectively. Field 730 includes block management data. In various embodiments, fields 722, 724, 726 and 728 collectively contain data transferred from host device 502 into flash memory 522. In various embodiments, fields 722, 724, 726 and 728 include 512 bytes of information. In several embodiments, fields 723, 725, 727 and 729 include 13 bytes of ECC check codes. In various embodiments, block management data 730 includes 10 bytes of block management information.

FIG. 7C illustrates a data structure of page 740 showing ECC combined with eight sectors and block management data, according to various embodiments of the invention. As shown in FIG. 7C, page 740 includes fields 741, 742 . . . 759.

Fields 741, 742 ... 748 represent sectors containing data bits. Fields 751, 752 ... 758 correspond to ECC check bits generated for sectors 741, 742 ... 748, respectively. Field 759 includes block management data. In various embodiments, sector fields 741, 742 ... 748 collectively contain data transferred from host device 502 into flash memory 522. In various embodiments, sectors 741, 742 ... 748 includes 512 bytes of information. In several embodiments, fields 751, 752 ... 758 includes 26 bytes of ECC check bits. In various embodiments, field 730 includes 10 bytes of block management information.

Figure 8:
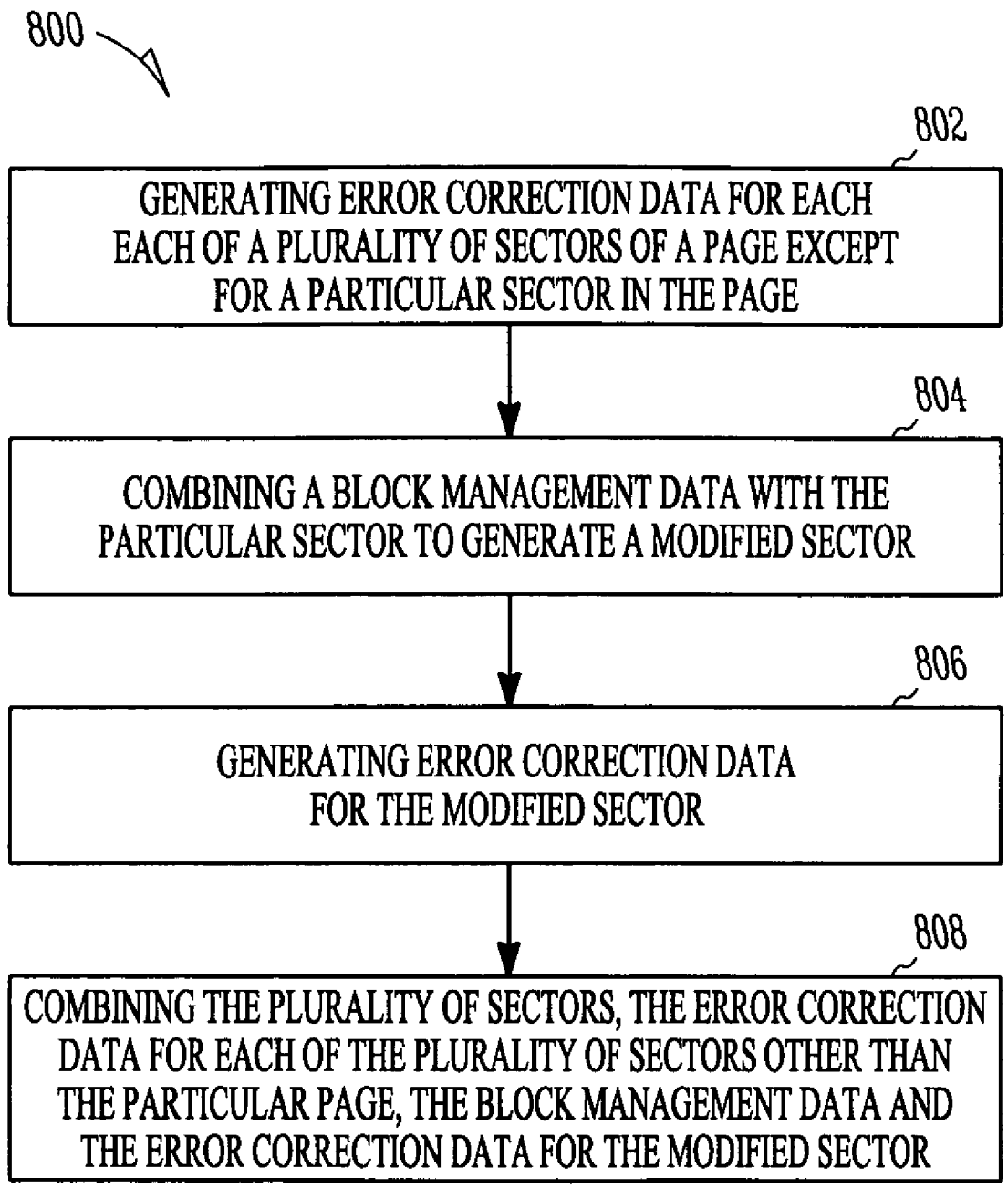
FIG. 8 illustrates a flow diagram showing a method of performing error correction in a NAND flash memory, according to various embodiments of the invention.

FIG. 8 illustrates a flow diagram showing a method 800 to perform error correction in a NAND flash memory, according to various embodiments. Method 800 may include at block 802 generating error correction data for each of a plurality of sectors of a page except for one or more selected sectors in the page. Method 800 may include at block 804 combining a block management data with the selected sector(s) to generate a modified sector. Method 800 may include at block 806 generating error correction data for the modified sector.

Method 800 may include at block 808 combining the plurality of sectors, the error correction data for each of the plurality of sectors other than the selected sectors, the block management data and the error correction data for the modified sector.

Figure 9:
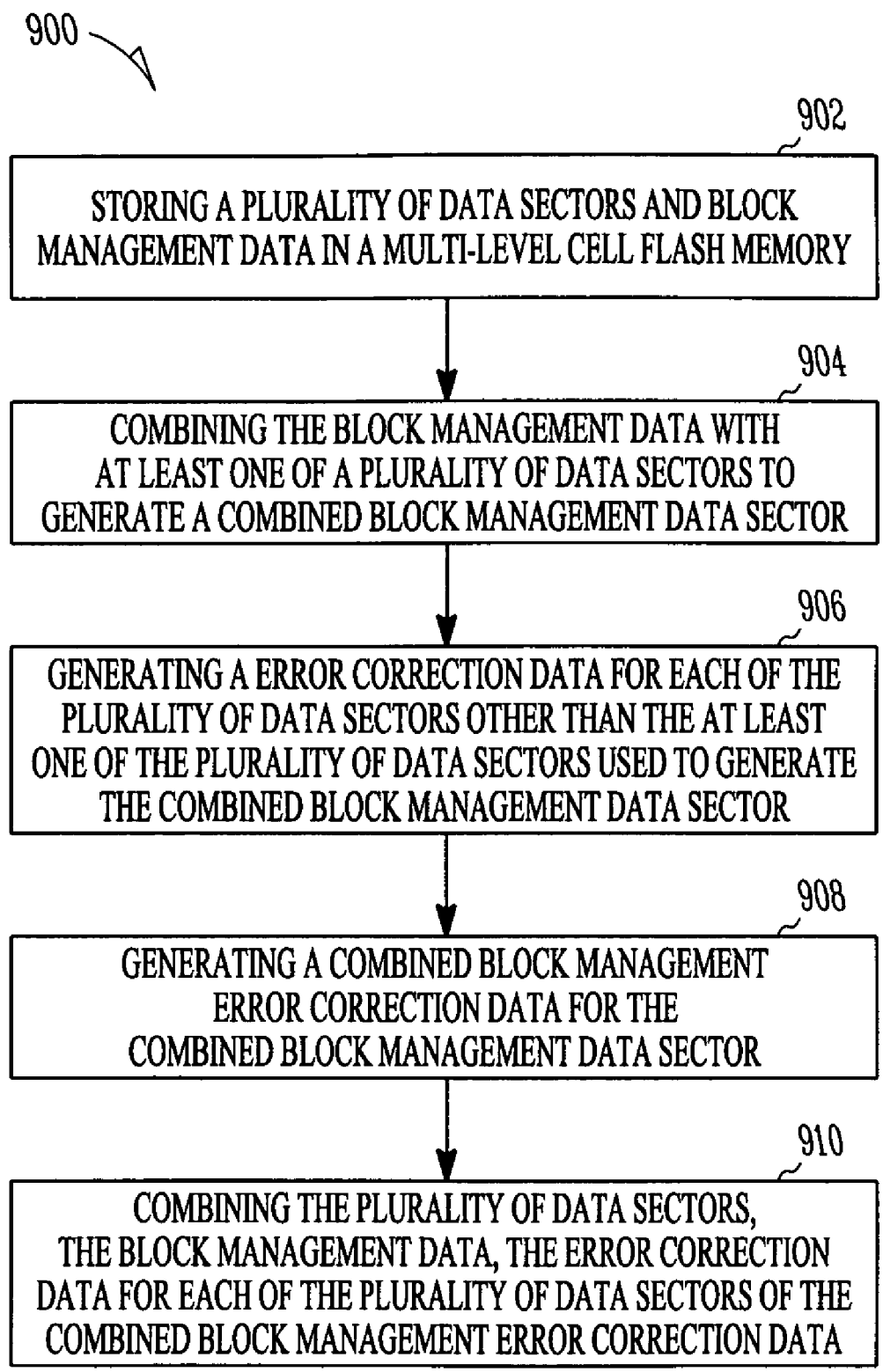
FIG. 9 illustrates a flow diagram showing a method of performing error correction in a NAND flash memory, according to various embodiments of the invention.

FIG. 9 illustrates a flow diagram showing a method 900 to perform error correction in a NAND flash memory, according to various embodiments. Method 900 may include at block 902 storing a plurality of data sectors and a block management data in a multi-level cell flash memory.

Method 900 may include at block 904 combining the block management data with at least one of a plurality of data sectors to generate a combined block management data sector.

Method 900 may include at block 906 generating an error correction data for each of the plurality of data sectors other than the at least one of the plurality of data sectors used to generate the combined block management data sector.

Method 900 may include at block 908 generating a combined block management error correction data for the combined block management data sector.

Method 900 may include at block 910 combining the plurality of data sectors, the block management data, the error correction data for each of the plurality of data sectors and the combined block management error correction data.

Implementing the apparatus, systems, and methods described herein may result in a better error correction function available for NAND flash memories. Additionally, there may be appreciable savings in the time for error correction operation and memory used for error correction.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

Voltage magnitudes for "low" logic signals and "high" logic signals are normally not defined since they can have a variety of relative values including negative voltages and positive voltages. "High" and "low" logic signals are defined only by their relationship to one another in representing binary values. Typically, a "high" logic signal has a voltage level or potential higher than a "low" logic signal, or the "low" signal may have a different polarity or negative polarity than the "high" signal. As those skilled in the art well understand, in some logic systems, a "high" logic value may even be represented by a ground potential when the relative "low" logic value is represented by a negative voltage potential in reference to ground.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

CONCLUSION

Various embodiments have been described here as a mechanism for programming system management data in a memory device. The programming may be conducted internally using an error correction module coupled between a buffer and a direct memory access. In various embodiments, the memory device includes an MLC NAND device.

What is claimed is:

1. A method comprising:
generating error correction data for each of a plurality of sectors of a page except for a particular sector in the page;
combining block management data with the particular sector to generate a modified sector;
generating error correction data for the modified sector; and
combining the plurality of sectors, the error correction data for each of the plurality of sectors other than the particular sector, the block management data and the error correction data for the modified sector.

2. The method of claim 1, comprising:
storing the plurality of sectors in a buffer based on a request from a memory controller.

3. The method of claim 1, comprising:
transferring the plurality of sectors and the block management data into a register within an error correction module.

4. The method of claim 1, comprising:
  storing the plurality of sectors, the error correction data for each of the plurality of sectors in the page other than the particular sector, the block management data, and the error correction data for the modified sector onto a multi-level cell (MLC) NAND flash memory.

5. The method of claim 4, including storing the plurality of sectors in a data area of the multi-level cell (MLC) NAND flash memory.

6. The method of claim 5, wherein generating the error correction check bits for each of the plurality of sectors includes generating the error check bits for the plurality of sectors of a page stored in the buffer coupled to the multi-level cell (MLC) NAND flash memory.

7. The method of claim 4, including storing the error correction data in a spare area of the multi-level cell (MLC) NAND flash memory.

8. The method of claim 7, wherein combining the block management data with the particular sector includes retrieving the block management data from the spare area of the multi-level cell (MLC) NAND flash memory.

9. The method of claim 8, wherein combining the block management data with the particular sector includes combining 12 bytes of block management data with 512 bytes of data in the particular sector.

10. The method of claim 7, wherein generating error correction check bits for each of the plurality of sectors includes generating 13 bytes of error correction check bits.

11. The method of claim 1, wherein storing the plurality of sectors includes storing 512 bytes of data corresponding to each of the plurality of sectors in the buffer.

12. A method comprising:
  storing a plurality of data sectors and block management data in a flash memory;
  combining the block management data with at least one of a plurality of data sectors to generate a combined block management data sector;
  generating error correction data for each of the plurality of data sectors other than the at least one of the plurality of data sectors used to generate the combined block management data sector;
  generating combined block management error correction data for the combined block management data sector; and
  combining the plurality of data sectors, the block management data, the error correction data for each of the plurality of data sectors, and the combined block management error correction data.

13. The method of claim 12, comprising:
  performing an error correction code (ECC) operation on data using a memory controller.

14. The method of claim 12, wherein storing the plurality of data sectors includes storing in a data area of a multi-level cell (MLC) NAND flash memory.

15. The method of claim 14, wherein storing the block management data includes storing in a spare area of the MLC NAND flash memory.

16. The method of claim 15, wherein generating error correction data includes storing the error correction data in the spare area of the MLC NAND flash memory.

17. The method of claim 15, wherein storing the block management data includes storing 12 bytes of block management data in the spare area of the MLC NAND flash memory.

18. The method of claim 15, wherein storing the block management data includes storing 10 bytes of block management data in the spare area of the MLC NAND flash memory.

19. The method of claim 14, wherein combining the plurality of data sectors, the block management data, the error correction data for each of the plurality of data sectors, and the combined block management error correction data includes storing a page in the MLC NAND flash memory.

20. The method of claim 19, wherein storing the page includes storing a page having at least four data sectors.

21. The method of claim 20, wherein storing the page having at least four data sectors includes storing data sectors having at least 512 bytes of data.

22. The method of claim 14, wherein generating error correction data includes generating 13 bytes of error correction check bits.

23. The method of claim 14, wherein generating error correction data includes generating 26 bytes of error correction check bits.

24. An apparatus comprising:
  a first multiplexer coupled between a buffer and a direct memory access control circuit, wherein the first multiplexer communicates data from a buffer to the direct memory access control circuit;
  a second multiplexer coupled between the buffer and the direct memory access, wherein the second multiplexer is to communicate data from the direct memory access to the buffer;
  an error correction check bits generator coupled to the first multiplexer;
  an error correcting module coupled to the second multiplexer and the buffer;
  a syndrome generator coupled between the error correcting module and the direct memory access, wherein the syndrome generator is to detect the presence of at least one bit error in data received from the direct memory access; and
  a block management module coupled to the error correction check bits generator, the error correcting module, the first multiplexer and the direct memory access, wherein the block management module is to generate a set of block management data.

25. The apparatus of claim 24, wherein the direct memory access is coupled to a multi-level cell (MLC) NAND flash memory.

26. The apparatus of claim 25, wherein the syndrome generator communicates the detected error to the error correcting module.

27. The apparatus of claim 26, wherein the syndrome generator is to generate a syndrome based on the detected errors in data communicated from the direct memory access to the buffer.

28. The apparatus of claim 27, wherein the block management module is to provide block management data for each page of data communicated from the buffer to the direct memory access, and the block management data is combined with a last sector of each page of data communicated from the buffer to the direct memory access.

29. The apparatus of claim 28, wherein the error correction check bits module is to generate an error correction code for each of the sectors of each page except for the last sector of each page.

30. The apparatus of claim 29, wherein the error correction check bits module is to generate an error correction code for the block management data and the last sector for each page.

31. The apparatus of claim 24, wherein the first multiplexer is to receive a page including a plurality of sectors, error correction data for each of the plurality of sectors except for a particular sector, and the block management data and error correction data for the particular sector combined with the block management data.

32. A computer-readable medium having stored thereon a data structure comprising:
- a first field containing a first sector of data bits;
- a second field containing a first set of error correction bits derived from the first field;
- a third field containing a second sector of data bits;
- a fourth field containing a set of block management bits; and
- a fifth field containing a second set of error correction bits derived from the third field and the fourth field.

33. A system, including:
- a processor;
- a display to couple to the processor;
- a wireless transceiver to couple to the processor; and
- a memory operatively coupled to the processor; wherein the memory is to generate error correction data for each of a plurality of sectors of a page except for a particular sector in the page, combine block management data with the particular sector to generate a modified sector, generate error correction data for the modified sector, and combine the plurality of sectors, the error correction data for each of the plurality of sectors other than the particular sector, the block management data and the error correction data for the modified sector.

34. The system of claim 33, comprising:
a lens; and
an imaging plane to couple to the processor, the imaging plane to receive light captured by the lens.

35. The system of claim 33, comprising:
a cellular telephone receiver forming a portion of the wireless transceiver.

36. The system of claim 33, comprising:
a set of media playback controls to couple to the processor.

* * * * *